[12] United States Patent  
Aoki et al.

(10) Patent No.: US 8,547,703 B2  
(45) Date of Patent: Oct. 1, 2013

(54) CARD-TYPE PERIPHERAL APPARATUS

(75) Inventors: Yoshitaka Aoki, Kanagawa (JP); Hitoshi Kimura, Tokyo (JP)

(73) Assignee: Sony Corporation, Tokyo (JP)

( * ) Notice: Subject to any disclaimer, the term of this patent is extended or adjusted under 35 U.S.C. 154(b) by 244 days.

(21) Appl. No.: 12/910,029

(22) Filed: Oct. 22, 2010

(65) Prior Publication Data

US 2011/0103027 A1    May 5, 2011

(30) Foreign Application Priority Data

Oct. 29, 2009    (JP) ................................. 2009-248644

(51) Int. Cl.
*H05K 5/00*    (2006.01)

(52) U.S. Cl.
USPC ........ 361/752; 361/679.2; 361/690; 361/695; 361/704; 361/715; 361/719; 361/728; 361/736; 361/740; 361/760; 174/252; 174/368; 174/521; 257/676; 257/679; 257/712; 257/713; 257/777; 29/831; 235/492; 700/2

(58) Field of Classification Search
USPC .............. 361/752, 679.2, 690, 695, 704, 715, 361/719, 728, 736, 737, 740, 760; 174/252, 174/368, 521; 257/676, 679, 712, 713, 777; 29/831; 235/492; 700/2
See application file for complete search history.

(56) References Cited

U.S. PATENT DOCUMENTS

| | | | |
|---|---|---|---|
| 5,208,732 A * | 5/1993 | Baudouin et al. ............. | 361/704 |
| 5,504,669 A * | 4/1996 | Wakabayashi et al. ........... | 700/2 |
| 5,889,654 A | 3/1999 | Pierson et al. | |
| 5,923,084 A * | 7/1999 | Inoue et al. .................... | 257/712 |
| 6,011,690 A | 1/2000 | Hughes et al. | |
| 6,031,718 A * | 2/2000 | Suzuki et al. ................. | 361/695 |
| 6,049,469 A | 4/2000 | Hood, III et al. | |
| 6,128,194 A | 10/2000 | Dexter et al. | |
| 6,163,474 A | 12/2000 | Prasanna et al. | |
| 6,188,576 B1 * | 2/2001 | Ali et al. ........................ | 361/704 |
| 6,189,203 B1 * | 2/2001 | Heinrich et al. ................ | 29/606 |
| 6,278,609 B1 * | 8/2001 | Suzuki et al. ................. | 361/704 |
| 6,353,538 B1 * | 3/2002 | Ali et al. ....................... | 361/728 |
| 6,362,966 B1 * | 3/2002 | Ali et al. ....................... | 361/728 |
| 6,483,702 B1 * | 11/2002 | Lofland ........................ | 361/704 |

(Continued)

FOREIGN PATENT DOCUMENTS

JP    08-263617    10/1996

OTHER PUBLICATIONS

Sony Corporation; EP Application No. 10012326.1; Extended EP Search Report; Jan. 24, 2011; 5 pages.

*Primary Examiner* — Xiaoliang Chen
(74) *Attorney, Agent, or Firm* — Dentons US LLP

(57) ABSTRACT

Disclosed herein is a card-type peripheral apparatus including: a case body configured to accommodate an electronic package including a circuit board between a first surface and a second surface that are opposite to each other; a first electronic package including a memory mounted on the circuit board; a second electronic package including an electronic part for controlling the memory mounted on the circuit board; a first thermal conductive material arranged inside the case body, the first thermal conductive material in contact with a surface of at least one of the first electronic package and the second electronic package; and a second thermal conductive material formed with the first surface and the second surface of the case body, wherein the first thermal conductive material and the second thermal conductive material are in contact with each other inside the case body.

9 Claims, 17 Drawing Sheets

(56) References Cited

U.S. PATENT DOCUMENTS

| | | | |
|---|---|---|---|
| 6,781,846 B1* | 8/2004 | Suzuki et al. | 361/737 |
| 7,375,975 B1* | 5/2008 | Jang et al. | 361/752 |
| 8,081,474 B1* | 12/2011 | Zohni et al. | 361/719 |
| 2001/0000988 A1* | 5/2001 | Farnworth et al. | 361/740 |
| 2002/0154480 A1* | 10/2002 | Wakabayashi et al. | 361/687 |
| 2002/0191379 A1* | 12/2002 | Wildrick et al. | 361/736 |
| 2003/0029920 A1* | 2/2003 | Chhor et al. | 235/492 |
| 2003/0086245 A1* | 5/2003 | Wakabayashi et al. | 361/719 |
| 2003/0155659 A1* | 8/2003 | Verma et al. | 257/777 |
| 2003/0193788 A1* | 10/2003 | Farnworth et al. | 361/752 |
| 2004/0141294 A1* | 7/2004 | Wakabayashi et al. | 361/719 |
| 2004/0160743 A1* | 8/2004 | Wu | 361/719 |
| 2004/0169285 A1* | 9/2004 | Verma et al. | 257/777 |
| 2005/0047096 A1* | 3/2005 | Wakabayashi et al. | 361/719 |
| 2006/0067054 A1 | 3/2006 | Wang et al. | |
| 2006/0118927 A1* | 6/2006 | Verma et al. | 257/676 |
| 2006/0268524 A1* | 11/2006 | Uehara et al. | 361/715 |
| 2007/0177357 A1* | 8/2007 | Wakabayashi et al. | 361/719 |
| 2008/0173996 A1* | 7/2008 | Han | 257/679 |
| 2008/0212297 A1* | 9/2008 | Ni et al. | 361/760 |
| 2009/0093137 A1* | 4/2009 | Badehi et al. | 439/61 |

* cited by examiner

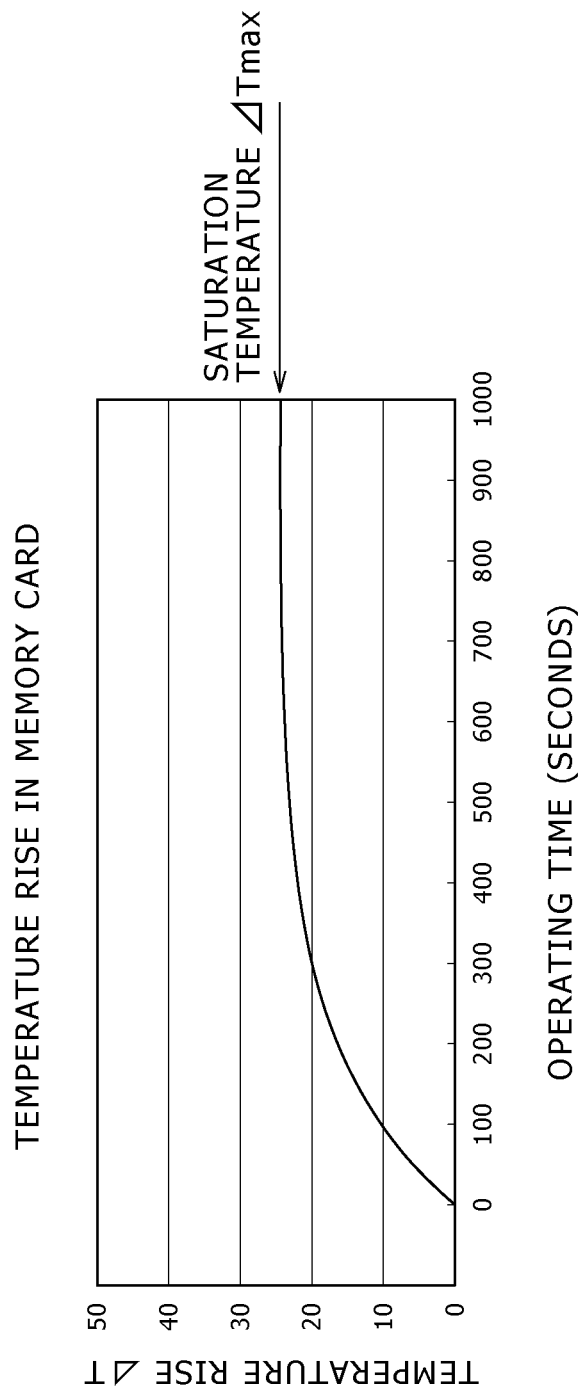

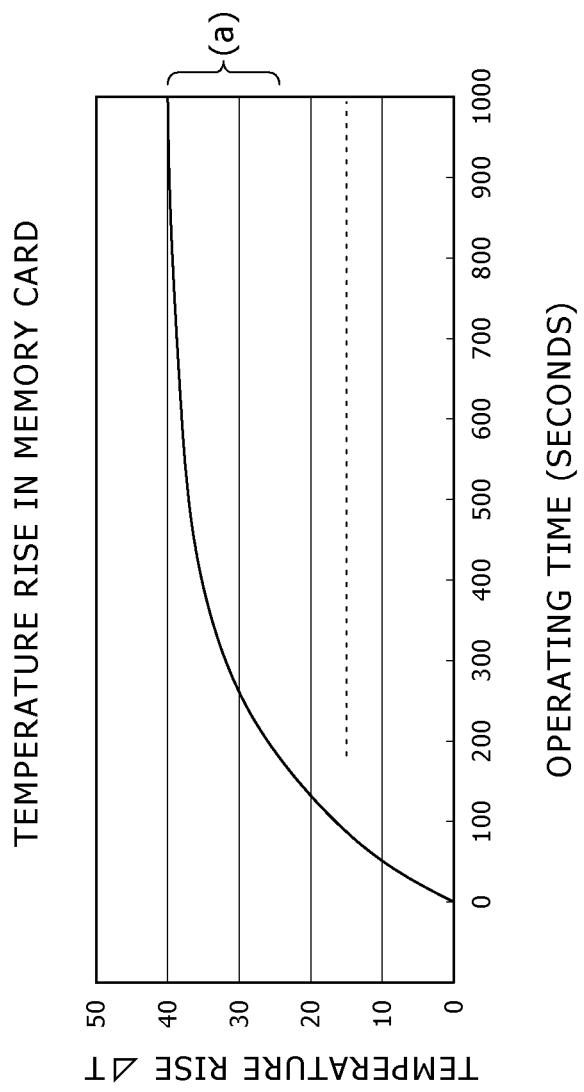

CARD-TYPE PERIPHERAL APPARATUS

BACKGROUND OF THE INVENTION

1. Field of the Invention

The present invention relates to a card-type peripheral apparatus, such as a memory card, for example.

2. Description of the Related Art

General-purpose memory cards are not so high in internal temperature rise caused by the power dissipation upon operation. This is an indication that the data transfer rates of these memory cards are not so high.

With those memory cards enhanced in data transfer rates, the heat dissipation thereof is achieved by the natural dissipation from the card surfaces and from the contact of a signal terminal and a power supply terminal of each card with connector contact pins of a connector in which the memory card is inserted.

The heat generated from the memory card is transmitted to a circuit board or the like over these connector contactors for heat dissipation, thereby holding down the rise of temperature internal to the memory card with an allowable range.

SUMMARY OF THE INVENTION

However, it should be noted here that the use of the serial interfacing, for example, tends to significantly increase data transfer rates, thereby increasing the power consumption caused by the raised controller operation clock rates and the parallel/serial conversion of data.

In addition, in the case where high-speed read/write operations are executed on flash memories, each operation must be done on many memory cells in parallel, which also can easily be supposed to lead to increased power dissipation.

The temperature rise internal to a memory card connected to a connector is schematically shown in FIG. 1.

The internal temperature of a memory card that has started operating rises up to a saturation temperature defined as a value unique to a system having this memory card.

If this saturation temperature does not exceed the allowable temperature range of each of the devices of the memory card when this memory card is in use at the upper limit of the operating temperature range, the heat dissipation and so on associated with this memory card and the system having this memory card need not be considered.

However, if the saturation temperature is in excess of the allowable temperature range of the internal devices as shown in FIG. 2, it is necessary to take measures for lowering the saturation temperature by releasing the heat shown in (a) to the outside of the system.

Generally taken as device allowable temperatures are the operation guarantee temperature of the controller, the record retention guarantee temperature of the flash memory, and the like.

For example, if the record retention guarantee temperature of a flash memory is 85° C. and if the operation upper limit of this memory card is 60° C., then the temperature that is permitted as an internal temperature rise is Δ25° C.

Consequently, in FIG. 2, if ΔTmax is expected to be 25 or higher, then it is necessary to lower ΔTmax by releasing the heat generated inside the memory card to the outside through a separate route.

Therefore, the present invention addresses the above-identified and other problems associated with related-art methods and apparatuses and solves the addressed problems by providing a card-type peripheral apparatus that is configured to significantly efficiently release the heat generated inside this apparatus and therefore raise the power dissipation, thereby increasing the data transfer rate of the apparatus.

In carrying out the invention and according to one embodiment thereof, there is provided a card-type peripheral apparatus. This card-type peripheral apparatus has a case body configured to accommodate an electronic package including a circuit board between a first surface and a second surface that are opposite to each other; a first electronic package including a memory mounted on the circuit board; a second electronic package including an electronic part for controlling the memory mounted on the circuit board; a first thermal conductive material arranged inside the case body, the first thermal conductive material in contact with a surface of at least one of the first electronic package and the second electronic package; and a second thermal conductive material formed with the first surface or the second surface of the case body. In this configuration, the first thermal conductive material and the second thermal conductive material are in contact with each other inside the case body.

According to embodiments of the invention, the heat generated inside the card-type peripheral apparatus can be released more efficiently than related-art technologies and therefore the power dissipation of the apparatus can be increased, thereby increasing the data transfer rate of the apparatus.

BRIEF DESCRIPTION OF THE DRAWINGS

Other features and advantages of the invention will become apparent from the following description of embodiments with reference to the accompanying drawings in which:

FIG. 1 is a first graph indicative of a temperature rise inside a memory card;

FIG. 2 is a second graph indicative of a temperature rise inside a memory card;

DETAILED DESCRIPTION OF THE PREFERRED EMBODIMENTS

This invention will be described in further detail by way of embodiments thereof with reference to the accompanying drawings.

The description will be made in the following order:
1. the first embodiment;
2. the second embodiment;
3. the third embodiment;
4. the fourth embodiment;
5. the fifth embodiment;
6. the sixth embodiment;
7. the seventh embodiment;
8. the eighth embodiment;
9. the ninth embodiment;
10. the tenth embodiment; and
11. the eleventh embodiment.

1. The First Embodiment

Figure 3A:
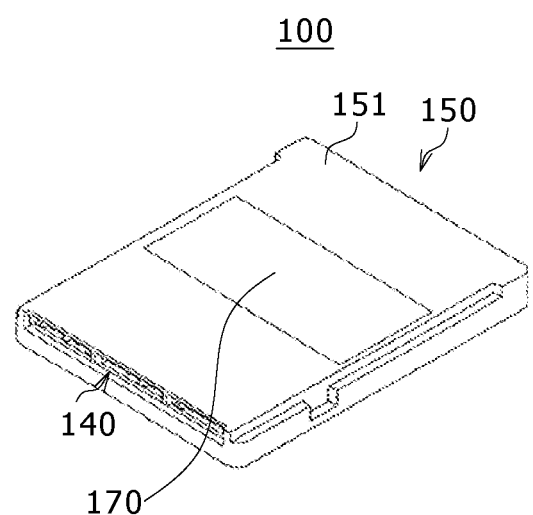
FIGS. 3A and 3B are perspective views illustrating external views of a memory card that functions as a card-type peripheral apparatus practiced as a first embodiment of the invention, FIG. 3A indicative of the memory card as viewed from a first side and FIG. 3B indicative of the memory card as viewed from a second side.
Figure 3B:
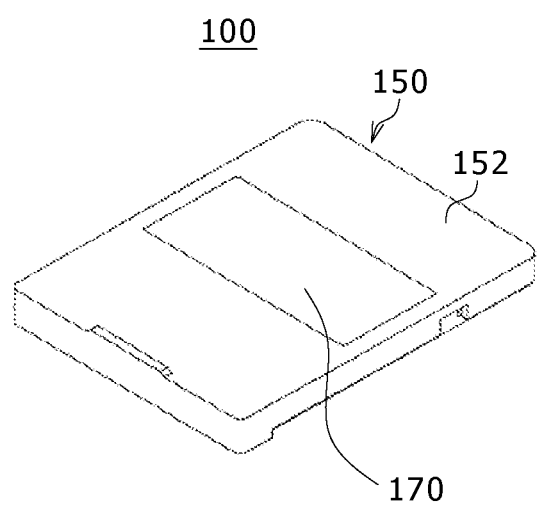

Now, referring to FIGS. 3A and 3B, there are shown external perspective views of a card-type peripheral apparatus (or a memory card) practiced as the first embodiment of the invention. FIG. 3A is a perspective view of the card-type peripheral apparatus as seen from a first side. FIG. 3B is a perspective view of the card-type peripheral apparatus as seen from a second side.

Figure 4A:
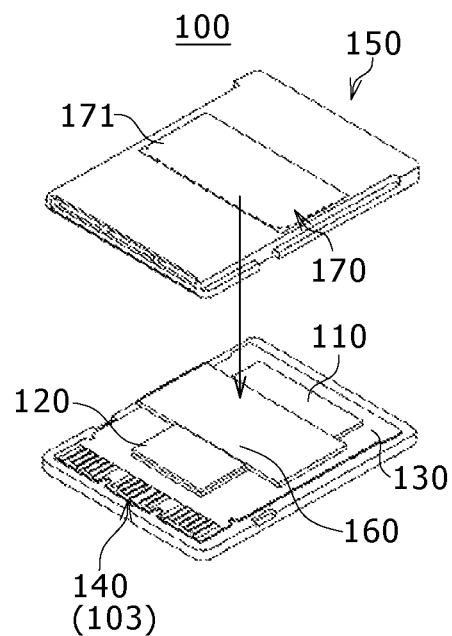
FIGS. 4A and 4B are diagrams illustrating an exemplary internal configuration of the card-type peripheral apparatus practiced as the first embodiment, FIG. 4A indicative of an exploded perspective view of the internal configuration and FIG. 4B indicative of a simplified cross section showing a heat release structure section.
Figure 4B:
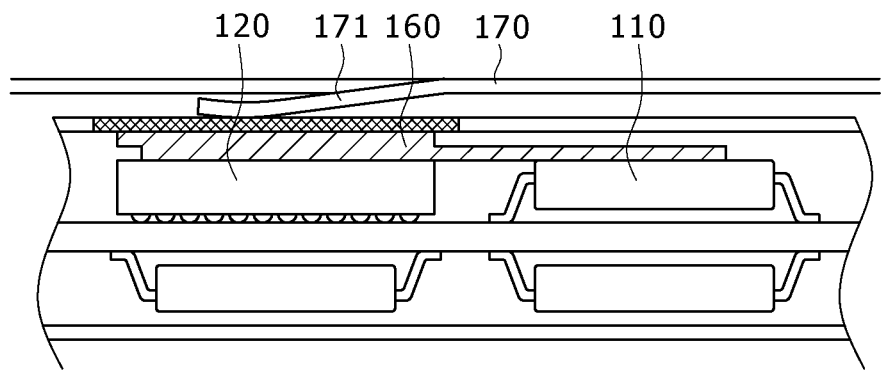

FIGS. 4A and 4B show an exemplary internal configuration of the card-type peripheral apparatus associated with the first embodiment. FIG. 4A is an exploded perspective view indicative of the internal configuration. FIG. 4B is a simplified cross section indicative of a heat release structure section of the card-type peripheral apparatus mentioned above.

Figure 5:
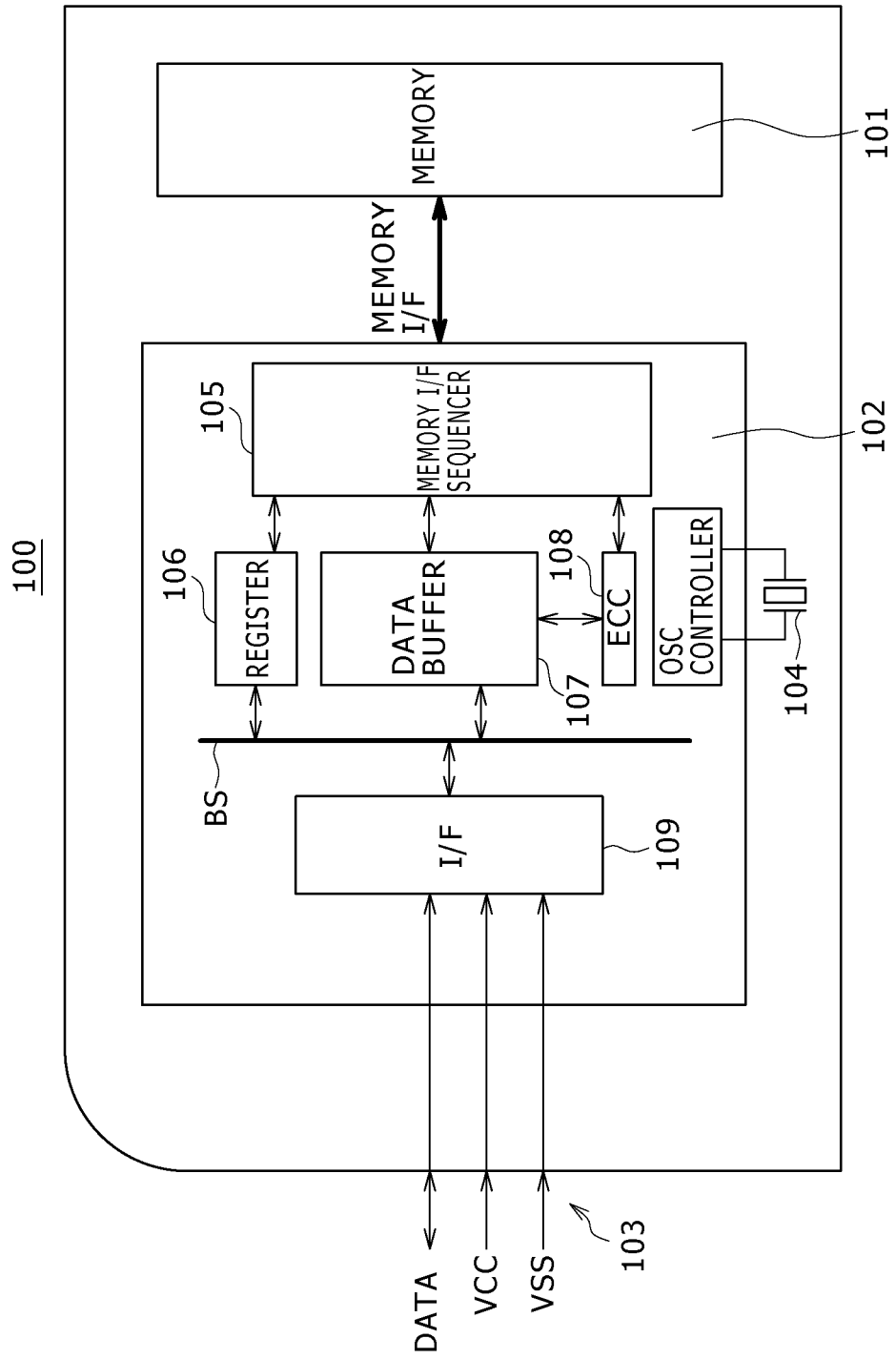
FIG. 5 is a block diagram illustrating an exemplary circuit configuration of the card-type peripheral apparatus of the above-mentioned embodiment.

FIG. 5 shows an exemplary circuit configuration of the card-type peripheral apparatus mentioned above.

First, the outlines of the configuration and function of the card-type peripheral apparatus (or the memory card) 100 associated with the embodiment mentioned above will be described.

The card-type peripheral apparatus 100 is configured as a memory card while maintaining the compatibilities in functions and the number of pins with removable media for high-performance mobile devices, such as video cameras and digital still cameras, in order to be used for a small-sized, high-density memory module.

In what follows, the card-type peripheral apparatus 100 will be described as a memory card.

As shown in FIG. 5, the card-type peripheral apparatus 100 associated with above-mentioned embodiment internally has a nonvolatile memory 101 that is a flash memory, a controller 102, and a connector section 103 that is for use in connecting the card-type peripheral apparatus 100 to a device subject to connection.

As shown in FIG. 4A, the nonvolatile memory 101 is formed as a first electronic package 110 and the controller 102 is packaged as a second electronic package 120, which are mounted on a circuit board 130.

It should be noted that the controller 102 has a crystal oscillator 104, a memory interface sequencer 105, a register 106, a data buffer 107, an error correction circuit (ECC) 108, an interface 109 on the side of the connector section 103, and a bus BS.

The memory card 100 is shaped in cuboid. The circuit board 130 and the first electronic package 110 and the second electronic package 120 mounted on the circuit board 130 are mainly accommodated between a first surface 151 of a case body 150 and a second surface 152 opposed to the first surface 151.

Two or more terminal sections 140 of the connector section 103 are formed on one end in the longer direction of the circuit board 130.

The terminal section 140 has a signal terminal and a power supply terminal aligned in line for access from outside the memory card to the nonvolatile memory 101 via the controller 102 for reading/writing data stored in the memory.

The memory card 100 is supplied with power from the terminal section 140 via a contact pin of a connector of a host device, not shown, in order to execute data transfer.

The first electronic package 110 is mounted on another end of the circuit board 130 and the second electronic package 120 is mounted in the longer direction adjacent to the first electronic package 110 near the center section.

The first electronic package 110 and the second electronic package 120 may become heat generating bodies inside the memory card. Especially, the second electronic package 120 having the controller 102 is estimated to generate much heat.

In the first embodiment, a first thermal conductive material 160 having a belt-like shape is arranged in contact with the surfaces of the first electronic package 110 and the second electronic package 120.

The first thermal conductive material 160 is arranged as fixed on the surfaces of the first electronic package 110 and the second electronic package 120 with an adhesive for example.

For the first thermal conductive material 160, the suitable material includes those having high thermal conductivities, such as silicon-type resins, aluminum, and copper and a heat pipe that has a thermal exchange function, for example.

A second thermal conductive material 170 that is a belt-shaped heat release area is formed on the first surface 151 or the second surface 152 or both of the case body 150 as opposed to the first thermal conductive material 160 arranged inside the case body 150.

A contactor 171 for making parts of the first thermal conductive material 160 and the second thermal conductive material 170 with each other is formed on one of the first thermal conductive material 160 and the second thermal conductive material 170 arranged as opposed, the second thermal conductive material 170 in the first embodiment.

The contactor 171 is formed such that the part of the second thermal conductive material 170 is notched so as to extend from the part of the second thermal conductive material 170 into the case body, for example.

For the second thermal conductive material 170, the suitable material includes those having high thermal conductivities, such as silicon-type resins, aluminum, and copper and a heat pipe that has a thermal exchange function, for example.

As described above, with the memory card 100 associated with the first embodiment, the second thermal conductive material 170 is formed with at least one part of the first surface 151 or the second surface 152 configured by a high thermal conductive material, such as a metal.

The first electronic package 110 and the second electronic package 120 that are the controller and the flash memory, respectively, generating heat inside the case body 150 of the memory card 100 are physically connected inside the case body 150 to the second thermal conductive material 170 by the first thermal conductive material 160 and the contactor 171.

Consequently, the heat generated by the first electronic package 110 and/or the second electronic package 120 that are the flash memory and the controller, respectively, can be directly transmitted efficiently and surely to the heat release area formed by the second thermal conductive material 170 on the card surface.

It should be noted that, for the size and shape of the heat release area formed by the second thermal conductive material 170, other sizes and shapes than a band shape are also applicable.

Figure 6:
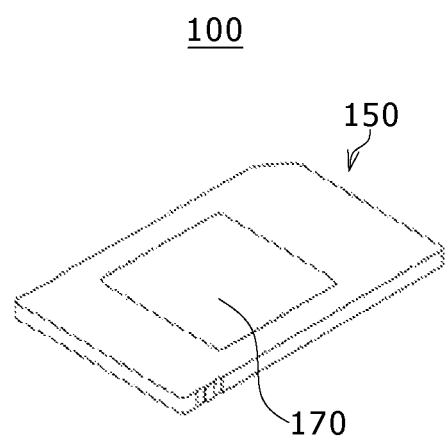
FIG. 6 is a perspective view of another exemplary shape of a heat release area formed by a second thermal conductive material.

For example, as shown in FIG. 6, the heat release area formed by the second thermal conductive material 170 may be formed in a square shape.

2. The Second Embodiment

Figure 7A:
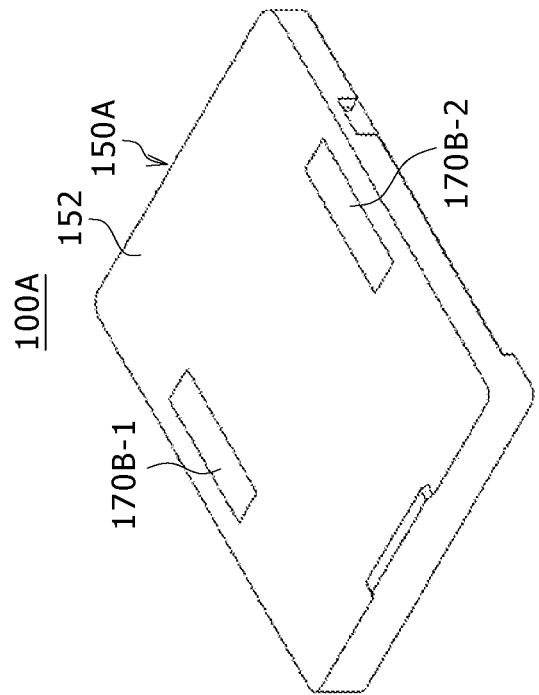
FIGS. 7A and 7B show perspective views of external views of a memory card as a card-type peripheral apparatus practiced as a second embodiment of the invention, FIG. 7A indicative of the memory card viewed from the first side and FIG. 8B indicative of the memory card viewed from the second side.
Figure 7B:
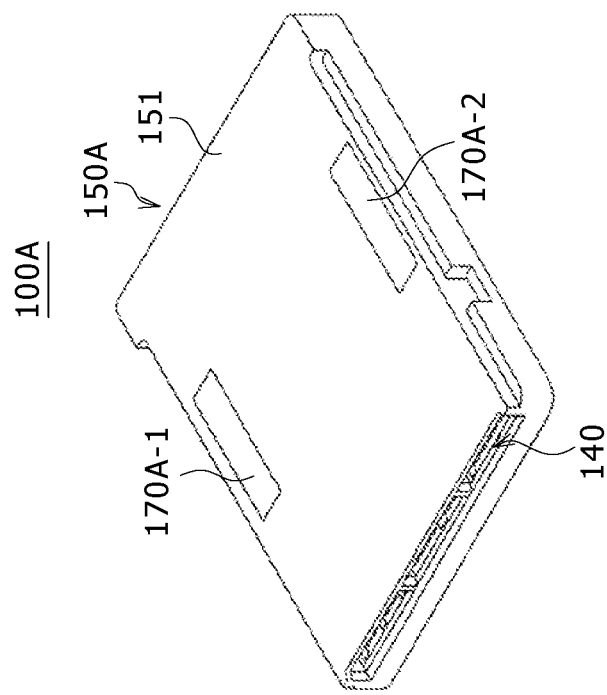

FIGS. 7A and 7B are external perspective views of a card-type peripheral apparatus (or a memory card) practiced as the second embodiment of the invention. FIG. 7A is a perspective view of this card-type peripheral apparatus as seen from a first side. FIG. 7B is a perspective view of this card-type peripheral apparatus as seen from a second side.

Figures 8A, 8B:
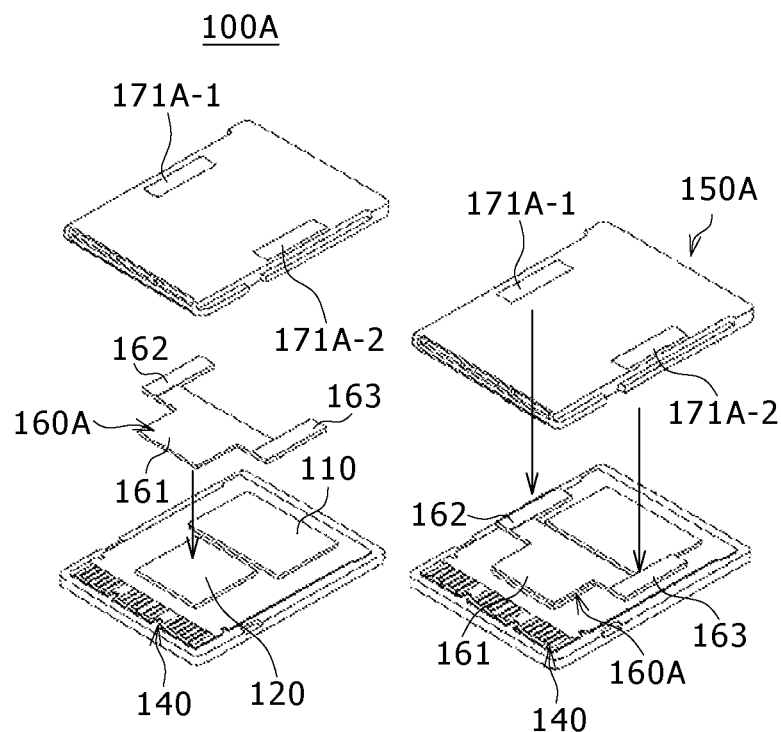
FIGS. 8A, 8B, and 8C are diagrams illustrating internal exemplary configurations of the card-type peripheral apparatus of the second embodiment, FIGS. 8A and B indicative of exploded perspective views and FIG. 8C indicative of a simplified cross section showing a heat release structure section.
Figure 8C:
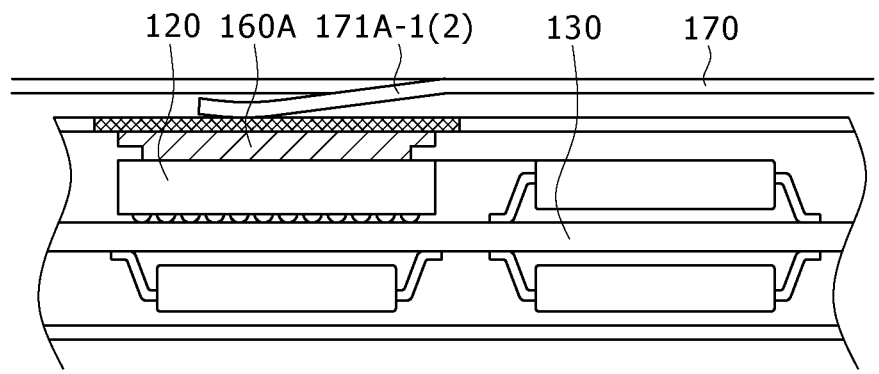

FIGS. 8A, 8B, and 8C show an exemplary internal configuration of the card-type peripheral apparatus of the second embodiment. FIGS. 8A and 8B are exploded perspective views of the internal configuration. FIG. 8C is a simplified cross section indicative of a heat release structure section.

A memory card 100A of the second embodiment differs from the memory card 100 of the first embodiment in that a heat release area based on a second thermal conductive material is arranged at two locations on the both rim sides along the length of the memory card 100A by avoiding the center section of the memory card.

To be more specific, with the memory card 100A, second thermal conductive materials 170A-1, 170A-2, 170B-1 and 170B-2 are arranged on a first surface 151 or a second surface 152 or both of a case body 150A.

As described above, a first electronic package 110 and a second electronic package 120 arranged inside the case body 150A may become heat generating bodies inside the memory card.

In the second embodiment, especially, a first thermal conductive material 160A is arranged only on the second electronic package 120 because the second electronic package 120 having a controller 102 generates much heat.

As shown in FIGS. 8A and 8B, the first thermal conductive material 160A has a first thermal conductive section 161 coming in contact all over with the surface of the second electronic package 120.

In addition, the first thermal conductive material 160A is formed to have a second thermal conductive section 162 and a third thermal conductive section 163 that are formed so as to extend in the side direction of the first electronic package 110 from both sides of the first thermal conductive section 161.

The second thermal conductive section 162 and the third thermal conductive section 163 are in contact with the two second thermal conductive materials 170A-1 and 170A-2 formed on both sides rims along the length of the case body 150A via contactor 171A-1 (171A-2).

The contactor 171A-1 (171A-2) is formed such that a part of the second thermal conductive materials 170A-1 and 170A-2 is notched so as to extend from the part of the second thermal conductive materials 170A-1 and 170A-2 into the case body 150A, for example.

As described above, with the memory card 100A of the second embodiment, the second thermal conductive materials 170A-1 and 170A-2 based on a material high in thermal conductivity such as a metal are formed on the two sides of the first surface 151 (or the second surface 152) by avoiding the center section.

The second electronic package 120 of the controller that is a heat generating body in the case body 150A of the memory card 100A is in contact with the first thermal conductive section 161 of first thermal conductive material 160A inside the case body 150A.

The second electronic package 120 is physically connected to the second and third thermal conductive sections 162 and 163 via the contactors 171A-1 and 171A-2.

Consequently, the heat generated by the second electronic package 120 that is the controller can be directly transmitted efficiently and surely to the heat release area formed by the second thermal conductive materials 170A-1 and 170A-2 arranged on the memory card surface.

In the second embodiment, the second thermal conductive material forming the heat release area is formed at two locations by avoiding the center section of the memory card 100A. The reason of this is as follows.

If the second thermal conductive material is arranged at the center section of the first surface 151 of the memory card 100A, for example, this area receives the internal heat when the memory card is in use and therefore has higher temperatures than in other areas of the surface.

Besides, this area is often held by user when the memory card is pulled after use. If the heat remains in this area, the heat is transmitted to the user, thereby possibly making the user uneasy. The second embodiment prevents this problem from happening.

In addition, the center section of the card surfaces is often attached with or printed with a product label and the like.

The heat release contactors of the connector slide on the attached or printed label, so that repeated sliding operations may damage the attached or printed label.

3. The Third Embodiment

Figure 9A:
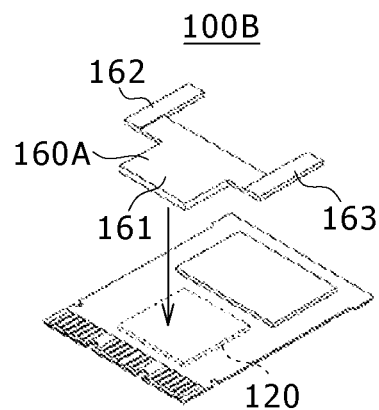
FIGS. 9A and 9B are diagrams illustrating exemplary internal configurations of a card-type peripheral apparatus practiced as a third embodiment of the invention, FIG. 9A indicative of an exploded perspective view and FIG. 9B indicative of a simplified cross section showing a heat release structure section.
Figure 9B:
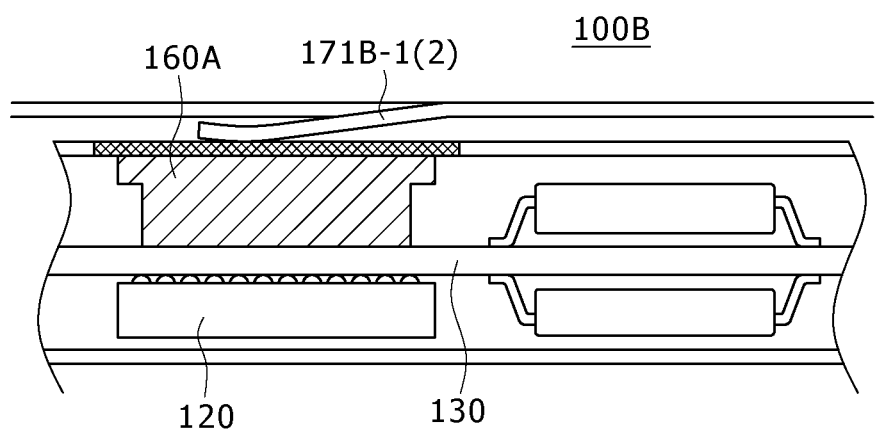

FIGS. 9A and 9B show an exemplary internal configuration of a card-type peripheral apparatus practiced as a third embodiment of the invention. FIG. 9A is an exploded perspective view indicative of the internal configuration. FIG. 9B is a simplified cross section indicative of a heat release structure section.

A memory card 100B of the third embodiment differs from the memory card 100A of the second embodiment in that a first thermal conductive material 160A is arranged immediately below a heat generating body that is a second electronic package 120 mounted on a circuit board 130.

In this example, as shown in FIG. 7B, second thermal conductive materials 170B-1 and 170B-2 having contactors are formed on both sides of a second surface 152 of a case body 150A.

According to the third embodiment, substantially the same effects as those of the second embodiment can be attained.

4. The Fourth Embodiment

Figures 10A, 10B:
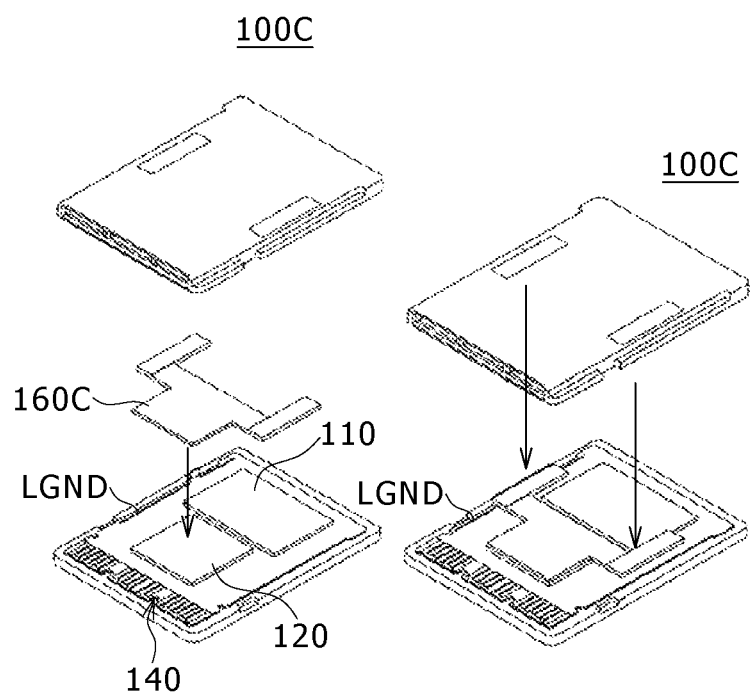
FIGS. 10A, 10B, and 10C are diagrams illustrating exemplary internal configurations of a card-type peripheral apparatus practiced as a fourth embodiment of the invention, FIGS. 10A and 10B indicative of exploded perspective views and FIG. 10C indicative of a simplified cross section showing a heat release structure section.
Figure 10C:
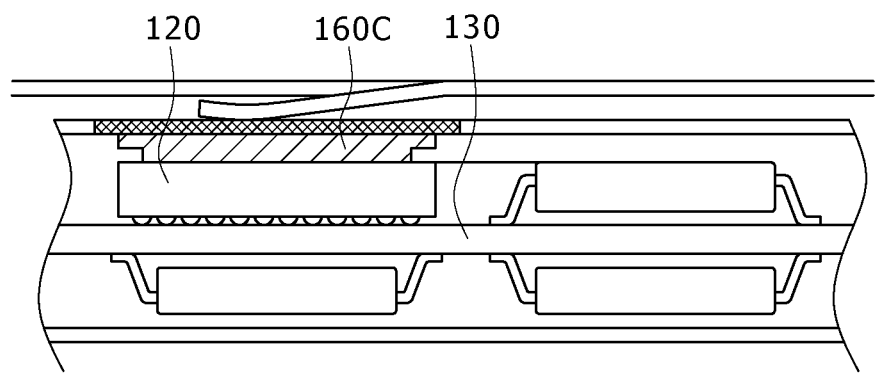

FIGS. 10A, 10B, and 10C show an exemplary internal configuration of a card-type peripheral apparatus practiced as a fourth embodiment of the invention. FIGS. 10A and 10B are exploded perspective views of the internal configuration. FIG. 10C is a simplified cross section indicative of heat release structure section.

A memory card 100C of the fourth embodiment differs from the memory card 100A of the second embodiment in the following points.

With the memory card 100C of the fourth embodiment, a first thermal conductive material 160C and a second thermal conductive material 170C are formed each by a heat conductive metal and a part of the first thermal conductive material 160C for example is connected to the ground of the memory card 100C inside a case body 150C.

For example, as shown in FIG. 10A, a configuration may be employed in which ground line LGND is formed on a rim of a circuit board 130 and one end of the first thermal conductive material 160C is connected to the ground line LGND.

Consequently, the heat release area gets substantially the same potential as ground, thereby functioning also as an area for EMI contact for electrostatic damage prevention.

With a small-size memory cards, the similar function is provided by the first contacting of the contactor of a connector with the ground terminal arranged in parallel to the signal line.

Figure 11:
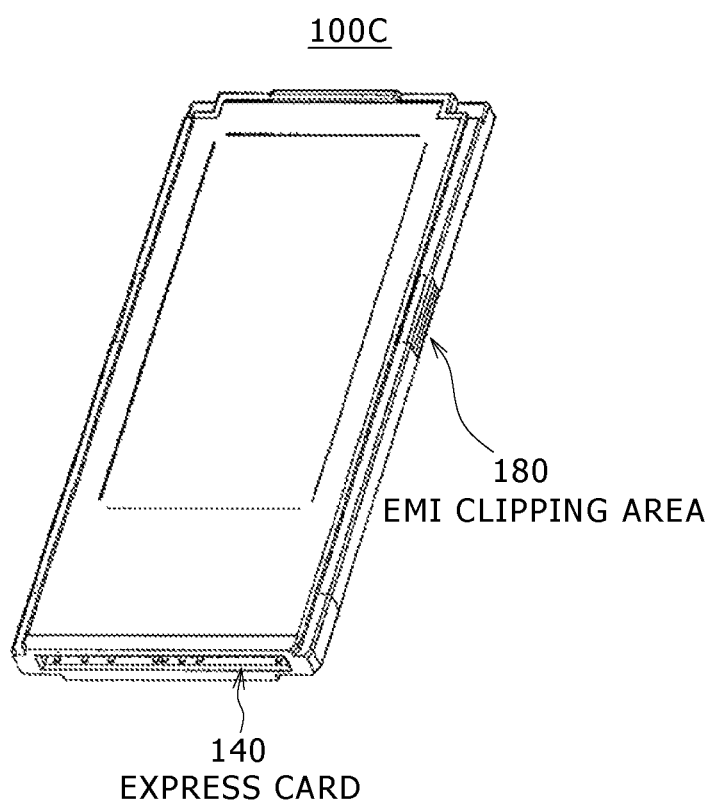
FIG. 11 shows a perspective view of an ExpressCard as one example of a card-type peripheral apparatus on which an EMI contact area is arranged on one side of the card.
Figure 12:
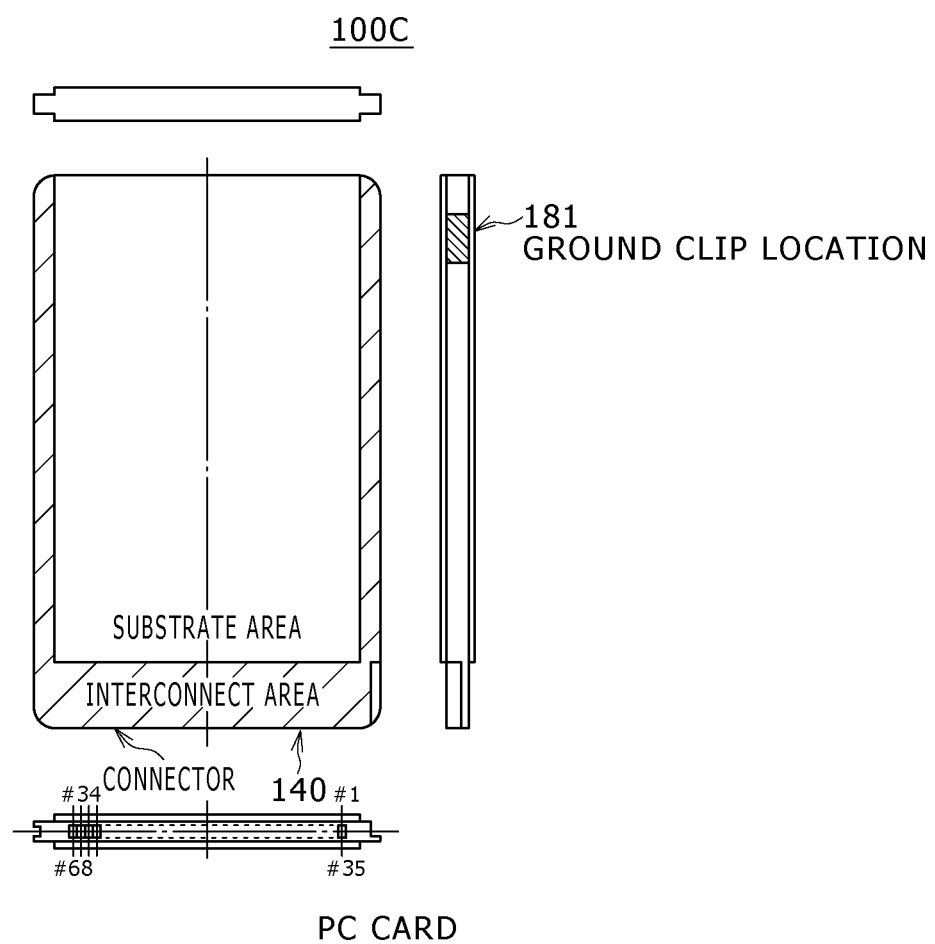
FIG. 12 shows a diagram illustrating an ExpressCard, from four sides thereof, as one example of a card-type peripheral apparatus on which an EMI contact area is arranged on one side of the card.

Alternatively, as shown in FIG. 11 and FIG. 12, there are cards in which contact areas 180 and 181 for EMI are arranged on the side of a memory card.

It should be noted that FIG. 11 shows an ExpressCard that is a card-type peripheral apparatus having high data transfer rates. FIG. 12 shows a PC card.

It should also be noted that the configuration in which ground connection is used is also applicable to other embodiments.

5. The Fifth Embodiment

Figure 13A:
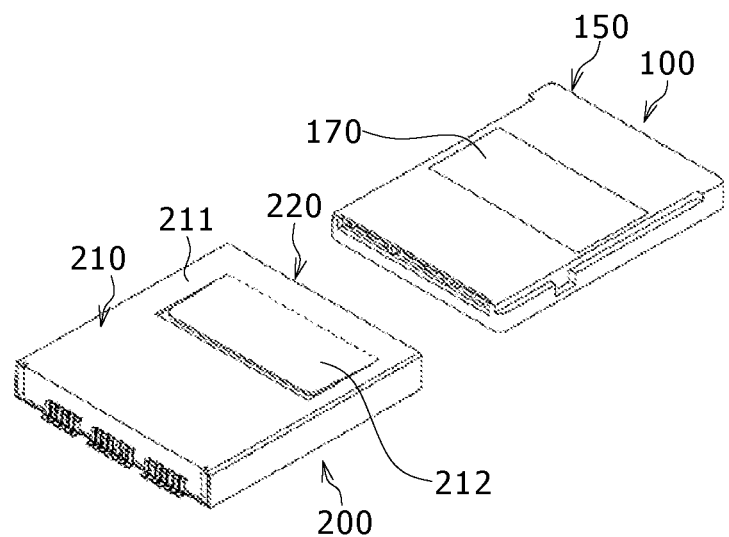
FIGS. 13A and 13B are diagrams illustrating an exemplary configuration of a card-type peripheral apparatus practiced as a fifth embodiment of the invention, FIG. 13A indicative of a perspective view of the card-type peripheral apparatus and a connector section that is a connection destination and FIG. 13B indicative of a simplified cross section of a heat release structure section.
Figure 13B:
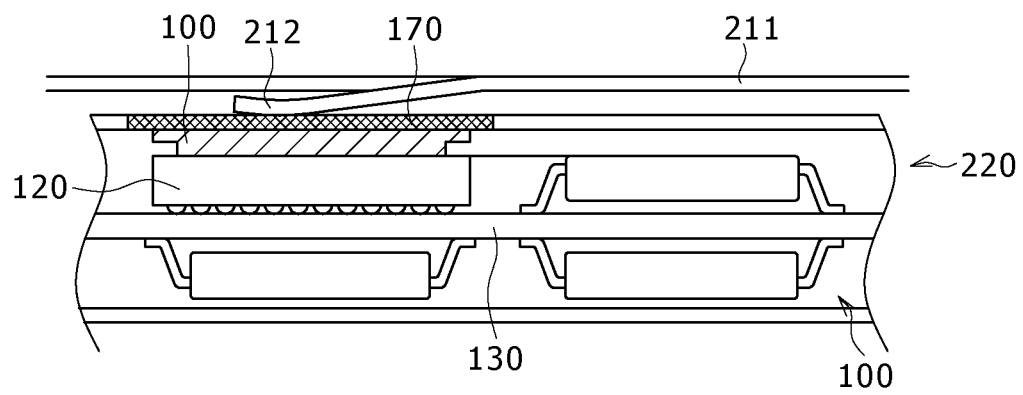

FIGS. 13A and 13B show an exemplary internal configuration of a card-type peripheral apparatus practiced as a fifth embodiment of the invention. FIG. 13A is a perspective view indicative of a configuration of a connector section between the card-type peripheral apparatus and a connection destination. FIG. 13B is a simplified cross section indicative of a heat release structure section.

In the fifth embodiment, the heat release structure of the memory card 100 of the first embodiment is also arranged on a connector section 200 of a device that is connected to the memory card 100 of the first embodiment.

To be more specific, a contactor 212 extending inside a housing 210 is formed on a top plate 211 for example of the housing that is a third thermal conductive material having thermal conductivity of the connector section 200.

This contactor 212 is formed in a belt shape so as to make contact with the entire width because the second thermal conductive material 170 of the memory card 100 is formed in a belt shape.

In this example, the contactor 212 is formed so as to extend from an opening section 220 of the housing 210 to the center of the housing 210.

This configuration smoothes the insertion of the memory card.

As described above, with the memory card 100, at least one of positions of the first surface 151 and the second surface 152 is formed by the second thermal conductive material 170 based on a material high in thermal conductivity such as a metal.

The second thermal conductive material 170 is physically connected to the controller and/or the flash memory package 110/120 that is the heat generating body inside the case body 150 of the memory card 100 via the first thermal conductive material 160 and the contactor 171 inside the case body 150.

Consequently, the heat generated by the first electronic package 110 and/or the second electronic package 120 that are the flash memory and the controller can be directly transmitted efficiently and surely to the heat release area formed by the second thermal conductive material 170 on the card surface.

Further, when the memory card 100 is inserted in the connector section 200, the second thermal conductive material 170 is physically connected to the housing 210 through the contactor 212 formed on the housing 210.

Consequently, the heat transmitted to the second thermal conductive material 170 from the inside of the memory card 110 can be transmitted efficiently and surely to the housing 210 of the connector section 200.

As described above, according to the fifth embodiment, the connector section 200 corresponding to the memory card 100 makes contact by the contactor 212 extending from a component member having a large surface area such as the housing 210 in the heat release area on the card.

With the connector section 200, the heat from the card is transmitted by the upper surface component member of the connector section.

Consequently, the heat of the card can be efficiently absorbed and then released.

6. The Sixth Embodiment

Figure 14A:
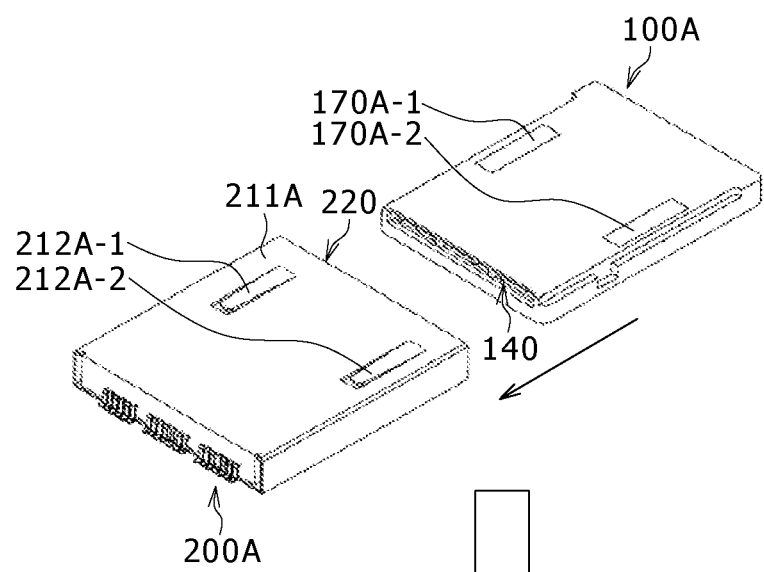
FIGS. 14A and 14B are perspective views of a card-type peripheral apparatus practiced as a sixth embodiment of the invention, FIG. 14A indicative of configurations of the card-type peripheral apparatus and a connector section that is a connection destination and FIG. 14B indicative of a state in which the card-type peripheral apparatus is connected to the connector section that is the connection destination.
Figure 14B:
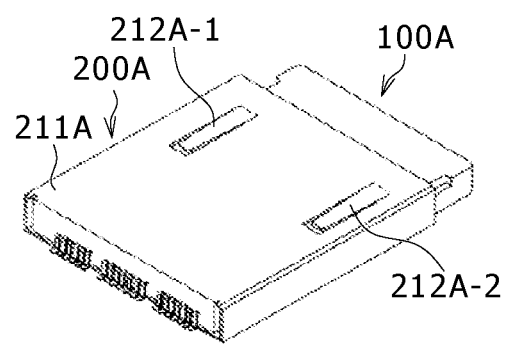

FIGS. 14A and 14B show an exemplary configuration of a card-type peripheral apparatus practiced as a sixth embodiment of the invention. FIG. 14A is a perspective view of the card-type peripheral apparatus and a connector section that is a connection destination. FIG. 14B is a perspective view indicative of a state in which the card-type peripheral apparatus is connected to the connector section that is the connection destination.

In the sixth embodiment, the heat release structure of the memory card 100A is also arranged on a connector section 200A that is a connection destination of the memory card 100A associated with the second embodiment.

To be more specific, contactors 212A-1 and 212A-2 extending through a housing 210A that is a third terminal conductive material having the thermal conductivity of the connector section 200A are formed on a top plate 211A of the housing 210A, for example.

With the contactors 212A-1 and 212A-2, the second thermal conductive material 170 of the memory card 100A is formed on the side of both rims along the length by avoiding the center section, so that the contactors 212A-1 and 212A-2 are formed at locations corresponding to the second thermal conductive material 170.

In this example, the contactors 212A-1 and 212A-2 are formed so as to extend from an opening section 220 of the housing 210A to the center section of the housing 210A.

This configuration smoothes the insertion of the memory card.

As described above, according to the sixth embodiment, the connector section 200A corresponding to the memory card 100A makes contact by the contactors 212A-1 and 212A-2 extending from a component material having a relatively large surface area such as the connector housing 210A on the heat release area of the card.

The heat from the card is transmitted by the upper surface component material of the connector section 200A.

Consequently, the heat of the card can be efficiently absorbed and released.

7. The Seventh Embodiment

Figure 15:
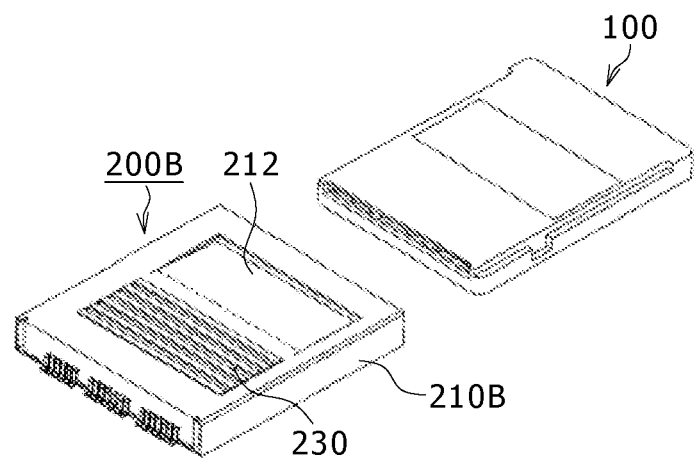
FIG. 15 shows perspective views of exemplary configurations of a card-type peripheral apparatus practiced as a seventh embodiment of the invention and a connector section that is a connection destination.

FIG. 15 shows exemplary configurations of a card-type peripheral apparatus and a connector section that is a connection destination practiced as the seventh embodiment of the invention.

A connector section 200B of the seventh embodiment differs from the connector section 200 of the fifth embodiment in that a corrugated plate 230 is arranged on a top plate 211 of a housing 210B in order to enhance heat release efficiency by increasing the thermal capacity and surface area of the component material on the side of the connector section.

The corrugated plate 230 is formed in an integrated manner with the housing 210B.

The other configurations are substantially the same as those of the fifth embodiment.

According to the seventh embodiment, the heat release efficiency can be further enhanced in addition to that of the fifth embodiment.

8. The Eighth Embodiment

Figure 16:
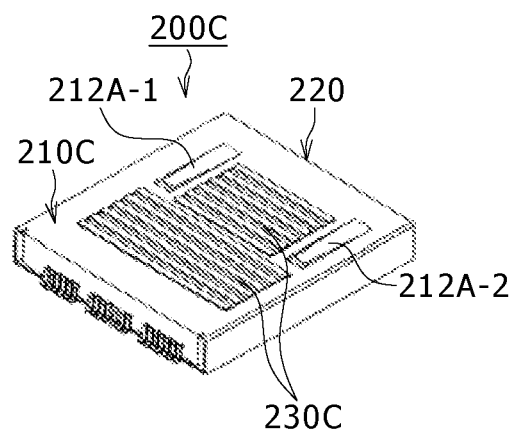
FIG. 16 shows a perspective view of an exemplary configuration of a connector section practiced as an eighth embodiment of the invention.

FIG. 16 shows an exemplary configuration of a connector section practiced as the eighth embodiment of the invention.

A connector section 200C of the eighth embodiment differs from the connector section 200A of the sixth embodiment in that a corrugated plate 230C is arranged on a top plate 211 of a housing 210C in order to enhance heat release efficiency by increasing the thermal capacity and surface area of the component material on the side of the connector section.

In this example, the corrugated plate 230C is also arranged between the areas where contactors 212A-1 and 212A-2 are formed.

The other configurations are substantially the same those of the sixth embodiment.

According to the eighth embodiment, the heat release efficiency can be enhanced still further in addition to that of the sixth embodiment.

9. The Ninth Embodiment

Figure 17:
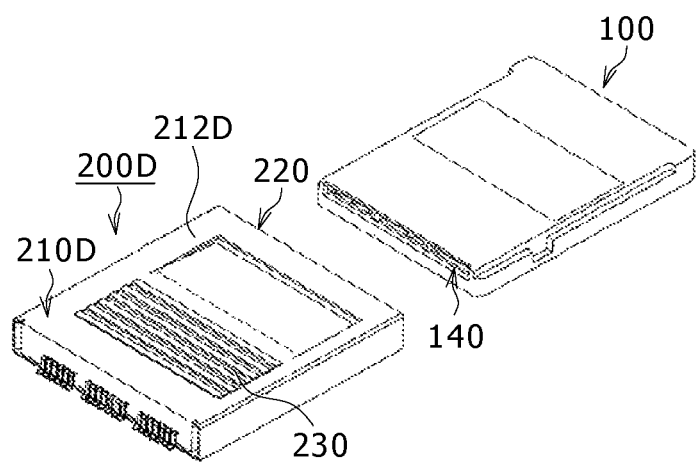
FIG. 17 shows perspective views of exemplary configurations of a card-type peripheral apparatus practiced as a ninth embodiment of the invention and a connector section that is a connection destination.

FIG. 17 shows an exemplary configuration of a card-type peripheral apparatus and a connector section that is a connection destination practiced as the ninth embodiment of the invention.

A connector section 200D of the ninth embodiment differs from the connector section 200B of the seventh embodiment in the direction in which a contactor 212D formed on a top plate 211 of a housing 210D is formed.

To be more specific, in the ninth embodiment, the contactor 212D is formed so as to extend from approximately the center section of the housing 210D to an opening section 220.

This configuration allows the contactor 212D to be connected to a section relatively large in area that functions as a heat release area of the housing 210D functioning as a third thermal conductive material, thereby further enhancing the heat release efficiency.

10. The Tenth Embodiment

Figure 18:
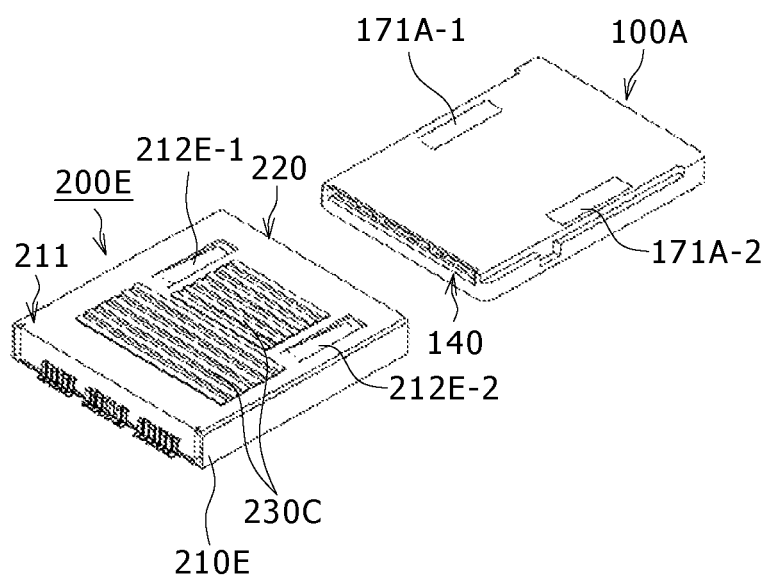
FIG. 18 shows perspective views of exemplary configurations a card-type peripheral apparatus practiced as a tenth embodiment of the invention and a connector section that is a connection destination.

FIG. 18 shows exemplary configurations of a card-type peripheral apparatus and a connector section that is a connection destination practiced as the tenth embodiment of the invention.

A connector section 200E of the tenth embodiment differs from the connector section 200C of the eighth embodiment in the direction in which contactors 212E-1 and 212E-2 formed on a top plate 211 of a housing 210E are formed.

To be more specific, in the tenth embodiment, contactors 212E-1 and 212E-2 are formed so as to extend through the housing 210E from approximately the center of the housing 210E to an opening section 220.

According to the above-mentioned configuration, the contactors 212E-1 and 212E-2 are connected to a portion relatively large in area that functions as a heat release area of the housing 210E functioning as a third thermal conductive material, thereby further enhancing the heat release efficiency.

11. The Eleventh Embodiment

Figure 19:
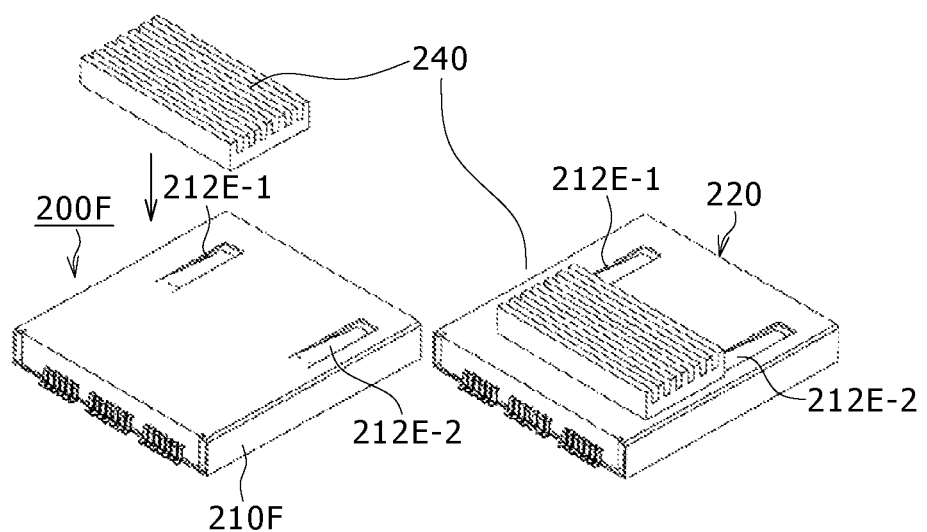
FIG. 19 shows perspective views of an exemplary configuration of a connector section practiced as an eleventh embodiment of the invention.

FIG. 19 shows an exemplary configuration of a connector section practiced as the eleventh embodiment of the invention.

A connector section 200F of the eleventh embodiment differs from the connector section 200E of the tenth embodiment in that a heat sink is formed on a top plate 211 of a housing 210F instead of the corrugated plate 230.

In this example, although the corrugated plate between the 212E-1 and 212E-2 is removed, it is practicable to also arrange this corrugated plate in that position.

12. Supplementary Explanations

In a card system practiced as one embodiment of the invention, a memory card has a two or more power modes.

The power modes are provided to operate the memory card in accordance with the power supply capabilities of corresponding devices. When the memory card is inserted in a corresponding device, the operation of the memory card starts in a minimum power dissipation mode.

If a corresponding device has a power supply capability, the corresponding device notifies the memory card of a mode appropriate at that moment. Receiving the notification, the memory card shift the operation mode to a mode in which the memory card can operate at a relatively high power (or high speed).

If a corresponding device is compatible only with a low power mode, the card connector inside the device need not have any of the structures of the above-mentioned embodiments.

However, it is also practicable to increase the heat release capacity of the connector to cope with the heat release inside the memory card together with power that can be supplied from the corresponding device and/or the power modes with which the corresponding device are compatible.

As described above and the embodiments of the invention, the following effects are achieved.

As the read/write speeds of memory cards increase, the power dissipation of each memory card increases due to the parallel operation of flash memories and the increased controller operation clock rate. The above-mentioned embodiments of the invention can prevent the heat generated inside each memory card due to the above-mentioned reasons from exceeding a shared temperature range of semiconductor devices and the like by means of the heat transmission and heat release through heat release areas and corresponding connectors.

In addition, configuring the heat release area on the card surface by a metal plate, conducting this metal plate to ground, and connecting the housing of the connector to ground allow the heat release area to be available as an EMI grip, thereby preventing the memory card from being electrostatistically damaged.

The present application contains subject matter related to that disclosed in Japanese Priority Patent Application JP 2009-248644 filed in the Japan Patent Office on Oct. 29, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A card-type peripheral apparatus comprising:
    a case body configured to accommodate an electronic package including a circuit board between a first surface and a second surface that are opposite to each other;
    a first electronic package including a memory mounted on said circuit board;
    a second electronic package including an electronic part for controlling said memory mounted on said circuit board;
    a first thermal conductive material arranged inside said case body, said first thermal conductive material in contact with a surface of at least one of said first electronic package and said second electronic package; and
    a second thermal conductive material formed with said first surface and said second surface of said case body,
    wherein,
        said first thermal conductive material and said second thermal conductive material are in contact with each other inside said case body via a contactor extended into said case body from a portion of one of said first thermal conductive material and second thermal conductive material, said contactor disposed in parallel with at least a portion of said case body.

2. The card-type peripheral apparatus according to claim 1, wherein a ground section is formed inside said case body and said first thermal conductive material and said second thermal conductive material conduct to said ground section.

3. The card-type peripheral apparatus according to claim 1, wherein said second thermal conductive material is formed on a rim side of at least one of said first surface and said second surface of said case body.

4. The card-type peripheral apparatus according to claim 3, wherein said second thermal conductive material is formed on the side of both rim sections along the length of said case body, in at least one of said first surface and said second surface.

5. The card-type peripheral apparatus according to claim 4, wherein:
    said first electronic package and said second electronic package are arranged along the length of said case body;
    said first thermal conductive material includes a first thermal conductive section in contact with the entire surface of said second electronic package and a second thermal conductive section and a third thermal conductive section that extend from both ends of said first thermal conductive section to a side of said first electronic package; and
    said second thermal conductive section and said third thermal conductive section are in contact with two second thermal conductive materials formed on the rim sections along the length of said case body via said contactor.

6. The card-type peripheral apparatus according to claim 1, further comprising:
    a connection terminal for connecting said card-type peripheral apparatus to a connector section of a device of connection destination, said connector section of said device of connection destination having a housing for guiding said card-type peripheral apparatus through an opening section of said device of connection destination, said housing, being formed by a third thermal conductive material, said third thermal conductive material including a second contactor coming in contact with a portion of said second thermal conductive material arranged inside said housing.

7. The card-type peripheral apparatus according to claim 6, wherein said second contactor is formed as notched in said third thermal conductive material so as to extend from a portion of said third thermal conductive material into said housing and a portion of said third thermal conductive material is selected so as to make an area of said housing a larger side.

8. The card-type peripheral apparatus according to claim 6, wherein said third thermal conductive material is formed as corrugated in surface.

9. The card-type peripheral apparatus according to claim 6, wherein a heat sink is formed on said third thermal conductive material.

* * * * *